United States Patent
Engelhardt et al.

(10) Patent No.: US 6,296,777 B1
(45) Date of Patent: Oct. 2, 2001

(54) STRUCTURING PROCESS

(75) Inventors: Manfred Engelhardt, Feldkirchen-Westerham; Volker Weinrich, München, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/128,388

(22) Filed: Aug. 3, 1998

(30) Foreign Application Priority Data

Aug. 1, 1997 (DE) .............................................. 197 33 345

(51) Int. Cl.⁷ ...................................................... C23F 1/02
(52) U.S. Cl. ................. 216/40; 216/47; 216/49; 216/51; 216/67; 216/72; 216/76; 216/77; 216/78; 216/79
(58) Field of Search .................................. 216/40, 41, 47, 216/49, 51, 67, 72, 76, 77, 78, 79

(56) References Cited

U.S. PATENT DOCUMENTS

| | | | |
|---|---|---|---|
| 4,244,799 | 1/1981 | Fraser et al. | 204/192 E |
| 5,071,714 | * 12/1991 | Rodbell et al. | 428/620 |
| 5,254,217 | 10/1993 | Maniar et al. | 156/656 |
| 5,403,438 | 4/1995 | Motoyama | 156/660 |
| 5,883,011 | 3/1999 | Lin et al. | 438/747 |
| 6,010,603 | * 1/2000 | Ye et al. | 204/192.35 |
| 6,051,858 | * 4/2000 | Uchida | 257/295 |

FOREIGN PATENT DOCUMENTS

| | | | |
|---|---|---|---|
| 0450302A1 | 10/1991 | (EP) . | |
| 0 786 805 A2 | 7/1997 | (EP) . | |
| 60-83331 | * 5/1985 | (JP) | H01L/21/302 |

OTHER PUBLICATIONS

Nulman et al., Local Plasma Oxidation and Reactive Ion Etching of metal films for Ultrafine Line Pattern Inversion and Transfer, J. Vac Sci. Technol. B 1 (4), pp. 1033–1036, Dec. 1983.*

"High Speed Anisotropic Reactive Ion Etching of Gold Films", F.T. Aldridge, J. Electrochem. Soc., vol. 142, No. 5, May 1995.

* cited by examiner

Primary Examiner—Randy Gulakowski
Assistant Examiner—Allan Olsen
(74) Attorney, Agent, or Firm—Herbert L. Lerner; Laurence A. Greenberg; Werner H. Stemer

(57) ABSTRACT

A layer is structured by first applying a sacrificial layer on the layer to be structured, forming a mask with an inorganic material on the sacrificial layer, then patterning the sacrificial layer and the layer to be structured through the mask, and, finally, removing the sacrificial layer and the mask.

22 Claims, 3 Drawing Sheets

STRUCTURING PROCESS

BACKGROUND OF THE INVENTION

FIELD OF THE INVENTION

The present invention relates to a structuring process, in particular a process for structuring layers which can be plasma- or dry-chemically etched only with difficulty or not at all, such as, for example, layers made of noble metals, ferroelectric materials and also dielectric materials having a high relative dielectric constant.

In the development of large-scale integrated memory components, such as e.g. DRAMs or FRAMs, the cell capacitance should be maintained or even improved as miniaturization progresses. In order to achieve this aim, ever thinner dielectric layers and folded capacitor electrodes (trench cell, stack cell) are used. Recently, the conventional silicon oxide has been replaced by the use of new materials, in particular paraelectrics and ferroelectrics, between the capacitor electrodes of a memory cell. For example, barium strontrium titanate (BST (Ba, Sr)$TiO_3$), lead zirconium titanate (PZT, Pb(Zr, Ti)$O_3$) or lanthanum-doped lead zirconium titanate or strontium bismuth tantalate (SBT, $SrBi_2Ta_2O_9$) are used for the capacitors of the memory cells in DRAMs or FRAMs.

These materials are thereby usually deposited on electrodes that are already present (bottom electrodes). Processing takes place at high temperatures, with the result that the materials of which the capacitor electrodes are normally composed, thus e.g. doped polysilicon, are easily oxidized and lose their electrically conductive properties, which would lead to failure of the memory cell.

Owing to their good oxidization resistance and/or the formation of electrically conductive oxides, 4d and 5d transition metals, in particular the platinum metals (Ru, Rh, Pd, Os, Ir, Pt) and, in particular, platinum itself, and also rhenium, are promising candidates that might replace doped polysilicon as electrode material in the above-mentioned memory cells.

The progressive miniaturization of devices also has the consequence that replacement materials are necessary for the aluminum which is used nowadays for the interconnections. In this case, the replacement material should have a lower resistivity and lower electromigration than aluminum. Copper is the most promising candidate in this context. Moreover, the development of magnetic random access memories (MRAMs) requires the integration of magnetic layers (e.g. Fe, Co, Ni or permalloy) in microelectronic circuits.

In order to be able to construct an integrated circuit from the materials mentioned, which have not yet become widespread in semiconductor technology, it is necessary to pattern thin layers of these materials.

The materials that have been used to date are generally structured by so-called plasma-assisted anisotropic etching processes. Physicochemical processes are usually employed in this context in which gas mixtures comprising one or more reactive gases, such as e.g. oxygen, chlorine, bromine, hydrogen chloride, hydrogen bromide or halogenated hydrocarbons, and noble gases (e.g. Ar, He) are used. These gas mixtures are generally excited in an alternating electromagnetic field at low pressures.

FIG. 8 shows the fundamental method of operation of an etching chamber, illustrated with reference to a parallel plate reactor 20. The gas mixture, e.g. Ar and $Cl_2$, is fed in via the gas inlet 21 of the actual reactor chamber 22 and is pumped away through the gas outlet 29. The lower plate 24 of the parallel plate reactor is connected to a radio frequency source 28 via a capacitor 27. The lower plate 24 serves as a substrate holder. The gas mixture is converted into a plasma 25 by the application of a radio frequency alternating electric field to the upper and lower plates 23, 24 of the parallel plate reactor. Since the mobility of the electrons is greater than that of the gas cations, the upper and lower plates 23, 24 are charged negatively with respect to the plasma 25. Therefore, both plates 23, 24 exert a high force of attraction on the positively charged gas cations, with the result that they are exposed to permanent bombardment by those ions, e.g. $Ar^+$. Since, moreover, the gas pressure is kept low, typically 0.1–10 Pa, there is only slight scattering of the ions among one another and at the neutral particles, and the ions impinge virtually perpendicularly on the surface of a substrate 26, which is held on the lower plate 24 of the parallel plate reactor. This allows good imaging of a non-illustrated mask on the underlying layer, to be etched, of the substrate 26.

Photoresists are usually used as mask materials since they can be patterned in a relatively simple manner by an exposure step and a development step.

The physical part of the etching is effected by impulse and kinetic energy of the impinging ions (e.g. $Cl_2^+$, $Ar^+$). In addition, this initiates or amplifies chemical reactions between the substrate and the reactive gas particles (ions, molecules, atoms, radicals) with the formation of volatile reaction products (chemical part of the etching). These chemical reactions between the substrate particles and the gas particles are responsible for high etching selectivities of the etching process.

Unfortunately, it has been found that the above-mentioned materials that are only just being introduced in integrated circuits belong to the materials which, chemically, cannot be etched or can be etched only with difficulty. The etching removal, therefore, even with the use of "reactive" gases, is based predominantly or almost exclusively on the physical component of the etching.

Owing to the small or absent chemical component of the etching, the etching removal of the layer to be patterned is of the same order of magnitude as the etching removal of the mask or of the support (etch stop layer). In other words, the etching selectivity with respect to the etching mask or support is generally small (between about 0.3 and 3.0). The consequence of this is that, due to the erosion of masks with inclined sidewalls and the unavoidable faceting (bevelling, tapering) of the masks, only low dimensional accuracy of the structuring can be ensured. This faceting limits the smallest feature sizes that can be obtained in the course of structuring.

Furthermore, redepositions of the material of the layer to be patterned may occur during the structuring of the layer to be patterned. These redepositions occur on the sidewalls of the resist mask, for example, and, frequently, they can be removed in subsequent process steps only at considerable expense. Since the redepositions increase as the proportion of argon in the etching gas mixture increases, the process implementation is usually limited to small proportions of argon for example in a chlorine-argon plasma. The increased proportion of chlorine in the etching gas mixture, however, in turn leads to increased faceting of the masks.

Furthermore, particularly in the case of an "overetch" step, the support is severely etched, resulting in bevelling of the etching sidewalls which is difficult to control.

SUMMARY OF THE INVENTION

It is accordingly an object of the invention to provide a structuring process, which overcomes the above-mentioned disadvantages of the prior art devices and methods of this general type.

With the foregoing and other objects in view there is provided, in accordance with the invention, a method of structuring a layer, which comprises:

placing a sacrificial layer on a layer to be structured;

forming a mask with an inorganic material on the sacrificial layer;

structuring the sacrificial layer and the layer to be structured with the mask; and removing the sacrificial layer and the mask.

The invention has the advantage that a mask containing an inorganic material has a greater resistance than photoresists, so that chemical "incineration" or ashing of the mask is prevented. The mask has very low removal rates during etching processes having a high physical component. The overall consequence of this is that the selectivity of the etching process is increased. The lower degree of mask erosion affords a higher dimensional accuracy of the structuring. Furthermore, the process according to the invention permits steeper etching sidewalls to be obtained on the layer to be patterned, even with reactive gases. Etching sidewalls having a sidewall angle of more than 85° can be produced.

The material of the sacrificial layer is chosen such that it can be removed more easily than the material of the mask. The invention thus has the advantage that the mask can also be removed without any difficulty on account of the sacrificial layer.

The layers to be patterned are frequently applied to an $SiO_2$ support. Topology elevations of the kind that otherwise occur during the removal of an $SiO_2$ hard mask, for example, can be reliably avoided by the process according to the invention.

In accordance with an added feature of the invention, the layer to be structured contains copper, iron, cobalt, nickel, a 4d or 5d transition metal, in particular a platinum metal.

Furthermore, it is preferred if the layer to be patterned contains a ferroelectric material, a dielectric material of high relative permittivity (>20), a perovskite or precursors of these materials. The term precursor of the materials should be understood to mean a material which can be converted into the materials mentioned by means of a suitable heat treatment (for example annealing), if appropriate with oxygen being fed into the process.

Thus, in accordance with another feature of the invention, the layer to be structured contains strontium bismuth tantalate (SBT, $SrBi_2Ta_2O_9$), strontium bismuth niobate tantalate (SBNT, $SrBi_2Ta_{2-x}Nb_xO_9$, x=0–2), lead zirconate titanate (PZT, $Pb(Zr, Ti)O_3$) or derivatives or barium strontium titanate (BST, $Ba_xSr_{1-x}TiO_3$ x=0–1), lead lanthanum titanate (PLZT, $(Pb, La) (Zr, Ti)O_3$) lead lanthanum zirconate titanate (PLZT, $(Pb, La) (Zr, Ti)O_3$) or derivatives.

In accordance with an additional feature of the invention, the layer to be structured contains platinum, gold, silver, iridium, palladium, ruthenium, rhenium, or oxides thereof.

In accordance with a further feature of the invention, the mask contains a silicon oxide, in particular $SiO_2$, a metal, in particular aluminum, titanium or tungsten, a metal nitride, preferably a titanium nitride, in particular $TiN_x$, wherein 0.8<x <1.2, or a metal silicide.

In accordance with again an added feature of the invention, the sacrificial layer contains an organic material, in particular polyimide, polysilicon, at least one spin-on glass layer or aluminum.

In accordance with again an additional mode of the invention, a reactive substance (e.g. a reactive gas), is provided during the dry etching of the layer to be structured.

In accordance with again another feature of the invention, the reactive gas is selected from the group consisting of the gases oxygen ($O_2$), nitrogen ($N_2$), and hydrogen ($H_2$), of gaseous fluorine compounds, chlorine ($Cl_2$), hydrogen halides, halogenated hydrocarbons or a mixture of these gases.

In accordance with again a further feature of the invention, a noble gas, in particular argon, is provided during the dry etching of the layer to be structured.

In accordance with yet a further feature of the invention, the dry etching of the layer is effected with a plasma etching process.

In accordance with yet an added feature of the invention, the sacrificial layer and the mask are removed by a lift-off technique. The sacrificial layer may alternatively be incinerated, and the mask material is then removed by "scrubber" cleaning.

In accordance with a concomitant feature of the invention, the material of the mask is patterned by means of a photographic technique. According to a preferred embodiment of the process according to the invention, the mask is firstly prepatterned using a resist mask and is completely patterned after the removal of the resist mask. This has the advantage that when the resist mask is removed, the sacrificial layer is still not uncovered, thereby avoiding premature damage to the sacrificial layer.

Other features which are considered as characteristic for the invention are set forth in the appended claims.

Although the invention is illustrated and described herein as embodied in a structuring process, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
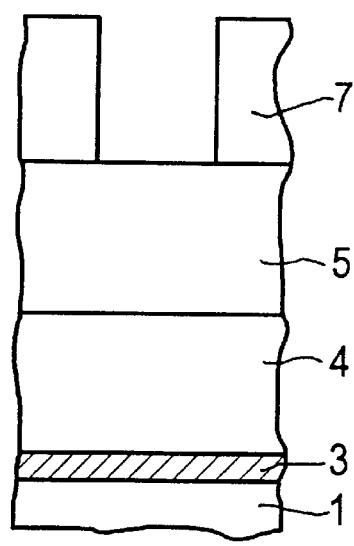
FIGS. 1 to 7 are partial, diagrammatic side views illustrating the process according to the invention.

Referring now to the figures of the drawing in detail and first, particularly, to FIG. 1 thereof, there is seen a platinum layer 3—the layer to be patterned—applied, for example by sputtering, on a suitable substrate 1, for example an $SiO_2$ substrate. A polyimide layer 4 is a sacrificial layer formed on the platinum layer 3. An $SiO_2$ layer 5 is applied to the polyimide layer 4, for example by means of a TEOS or silane process. The $SiO_2$ layer will later serve as $SiO_2$ hard mask 6 for the structuring of the polyimide layer 4 and of the platinum layer 3. A resist layer is applied to the $SiO_2$ layer 5 and, by an exposure step and a development step, serves as resist mask 7 for the structuring of the $SiO_2$ layer 5. The resulting structure is shown in FIG. 1.

Figure 2:
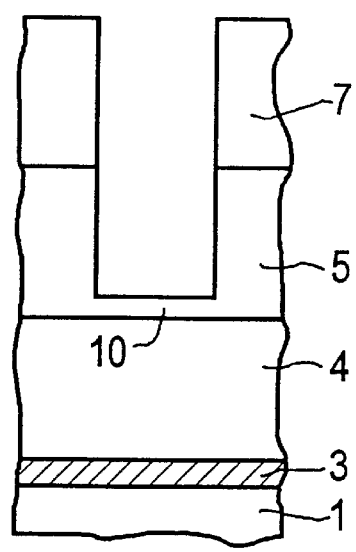

Subsequently, the $SiO_2$ layer 5 is anisotropically etched plasma-chemically so that it can serve as mask 6 for the subsequent structuring of the sacrificial layer 4 and of the platinum layer 3. The etching gases used in this case may be, for example, $CHF_3/CF_4$ or $C_4F_8/CO$. However, the $SiO_2$ layer 5 is not yet completely structured in this step. The plasma-chemical etching is carried out in such a way that the sacrificial layer 4 is at least still covered with a thin region 10 of the $SiO_2$ layer 5 at any point. The thickness of the thin region 10 of the $SiO_2$ layer 5 is advantageously 25% of the thickness of the $SiO_2$ layer 5. The resulting structure is shown in FIG. 2.

Figure 3:
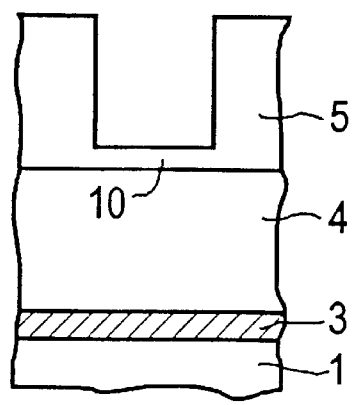

The resist mask 7 is subsequently removed by a wet-chemical process or by incineration, the polyimide layer 3 being protected by the thin regions 10 of the $SiO_2$ layer. The resulting structure is shown in FIG. 3.

As an alternative, however, the resist mask 7 may also be removed only after the structuring of the platinum layer 3. In this case, the resist mask 7 that has remained strengthens the $SiO_2$ layer 5 that serves as mask.

Figure 4:
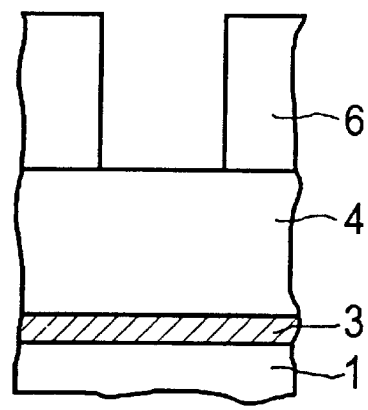

The residual $SiO_2$ layer 5, 10 is then etched through anisotropically, thereby producing the $SiO_2$ hard mask 6. As a result of this process step, the polyimide layer 4 is uncovered at the bottom of the structure openings. For the subsequent process steps, about 75% of the thickness of the $SiO_2$ layer 5 is still available for the $SiO_2$ hard mask 6. The resulting structure is shown in FIG. 4.

Figure 5:
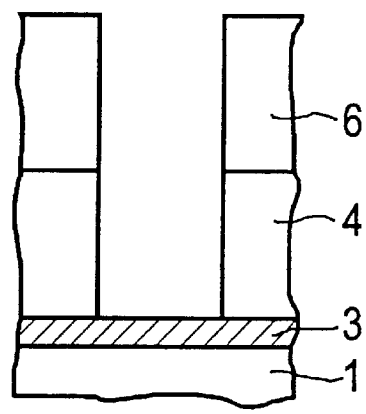

Subsequently, the polyimide layer 4 is anisotropically etched plasma-chemically, thereby uncovering that region of the platinum layer 3 which is to be removed. The etching gas used for this is a mixture of oxygen and argon. The resulting structure is shown in FIG. 5.

Figure 6:
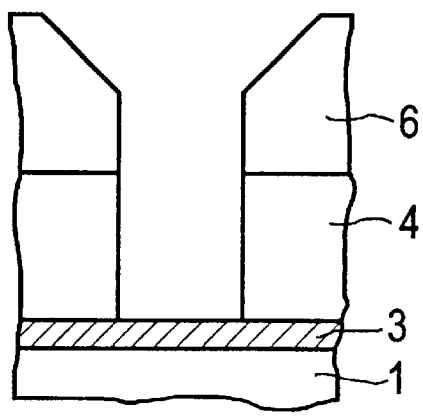

Reactive ion etching (RIE) is then carried out in order to subject the platinum layer 3 to chemical-physical dry etching. The etching gas used in this case is, for example, argon with an addition of chlorine $Cl_2$ and oxygen $O_2$. Instead of reactive ion etching, it is also possible to use other plasma etching processes such as, for example, magnetically enhanced reactive ion etching (MERIE), ECR etching (ECR, Electron Cyclotron Resonance) or inductively coupled plasma etching processes (ICP, TCP). The resulting structure is shown in FIG. 6.

Since the etching gas used may be argon with an addition of chlorine $Cl_2$, without the occurrence of excessively great faceting of the mask 6, redepositions of platinum on the sidewalls of the polyimide layer 4 can be avoided. The lower degree of mask erosion affords higher dimensional accuracy of the structuring. Furthermore, it is consequently possible to achieve steeper etching sidewalls on the layer to be patterned. Etching sidewalls with a sidewall angle of more than 85° can be produced. Consequently, the process according to the invention enables virtually vertical profiles to be produced and, at the same time avoids redepositions.

Figure 7:
Figure 8:
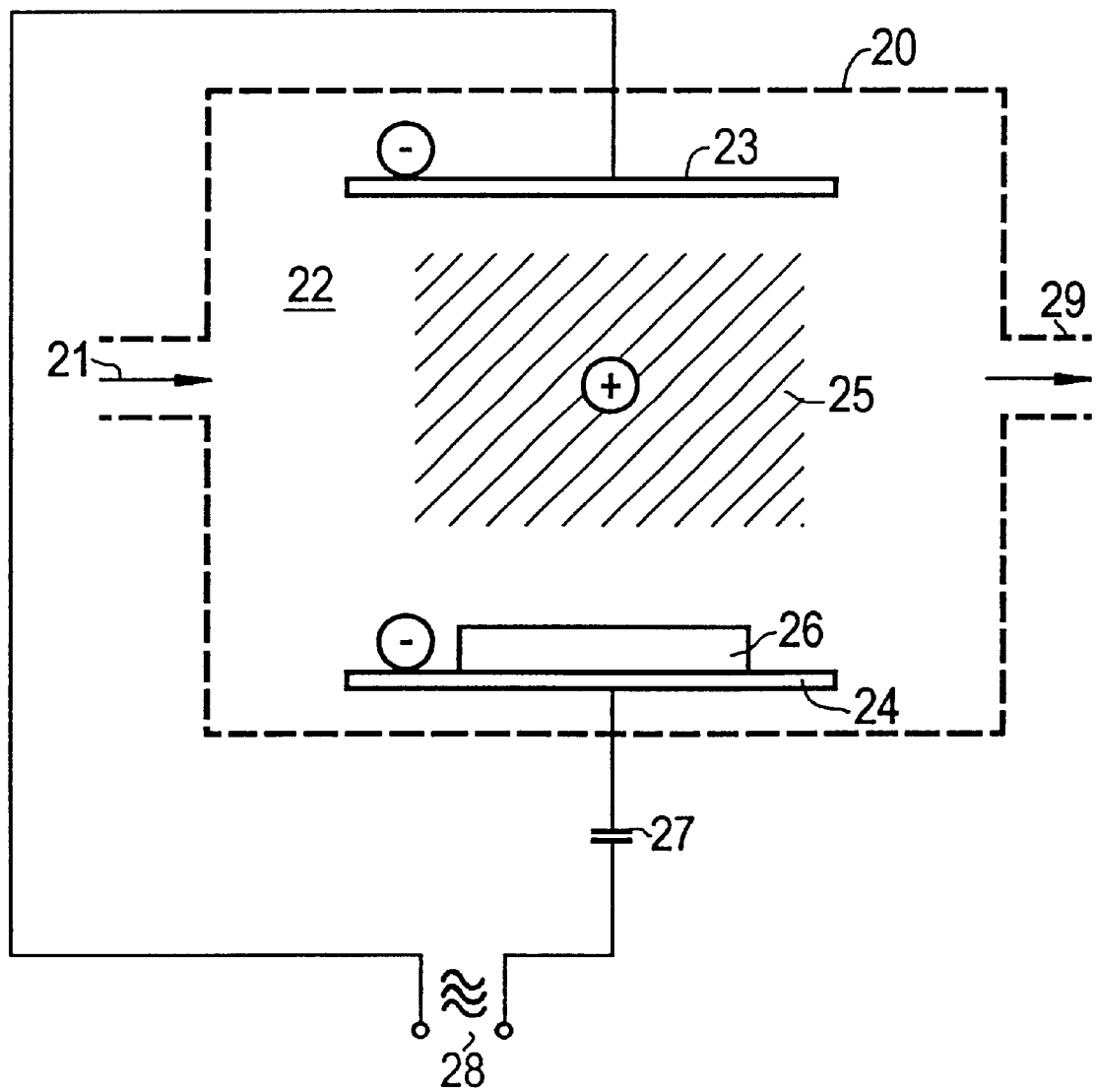
FIG. 8 shows a diagrammatic illustration of a parallel plate reactor etching chamber.

Subsequently, the sandwich mask comprising the polyimide layer 4 and the $SiO_2$ mask 6 that has remained is also removed by a lift-off technique. The resulting structure is shown in FIG. 7.

The invention thus has the advantage that the $SiO_2$ mask 6 can easily be removed again on account of the sacrificial layer 4. Topology elevations of the kind that otherwise occur during the removal of an $SiO_2$ hard mask can be reliably avoided by the process according to the invention.

We claim:

1. A method of structuring a layer, which comprises:
   placing a sacrificial layer made of an organic material on a layer to be structured;
   forming a mask layer with an inorganic material on the sacrificial layer;
   forming a photomask on the mask layer;
   partially etching the mask layer using the photomask to remove the mask layer in areas not covered by the photomask except for a remaining thin region of the mask layer completely covering the sacrificial layer;
   removing the photomask;
   anisotropically etching the mask layer to remove the thin region to create a mask;
   structuring the sacrificial layer and the layer to be structured with the mask; and
   removing the sacrificial layer and the mask.

2. The method according to claim 1, wherein the layer to be structured contains a material selected from the group consisting of copper, iron, cobalt, nickel, a $4d$ transition metal, a $5d$ transition metal, an oxide of copper, an oxide of iron, an oxide of cobalt, an oxide of nickel, an oxide of a $4d$ transition metal, and an oxide of a $5d$ transition metal.

3. The method according to claim 2, wherein the layer to be structured contains a material selected from the group consisting of platinum, gold, silver, iridium, palladium, ruthenium, rhenium, and oxides thereof.

4. The method according to claim 1, wherein the layer to be structured contains a platinum metal.

5. The method according to claim 1, wherein the layer to be structured contains a material selected from the group consisting of ferroelectric material, a dielectric material of high relative permittivity, and a perovskite.

6. The method according to claim 1, wherein the layer to be structured contains a material selected from the group consisting of strontium bismuth tantalate, strontium bismuth niobate tantalate, lead zirconate titanate, barium strontium titanate, lead lanthanum titanate, and lead lanthanum zirconate titanate.

7. The method according to claim 1, wherein the forming step comprises forming the mask with a material selected from the group consisting of a silicon oxide, a metal, a metal nitride, and a metal silicide.

8. The method according to claim 7, wherein the forming step comprises forming the mask with $SiO_2$.

9. The method according to claim 7, wherein the forming step comprises forming the mask with a metal selected from the group consisting of a aluminum, titanium, and tungsten.

10. The method according to claim 7, wherein the forming step comprises forming the mask with titanium nitride.

11. The method according to claim 7, wherein the forming step comprises forming the mask with $TiN_x$, where $0.8<x<1.2$.

12. The method according to claim 1, wherein the organic material is polyimide.

13. The method according to claim 1, wherein the structuring step comprises dry etching with a reactive substance.

14. The method according to claim 13, wherein the reactive substance is a reactive gas.

15. The method according to claim 14, wherein the reactive gas is selected from the group consisting of oxygen gas, nitrogen gas, hydrogen gas, gaseous fluorine compounds, hydrogen halides, halogenated hydrocarbons, chlorine, and a mixture thereof.

16. The method according to claim 1, wherein the structuring step comprises dry etching the layer to be structured with a noble gas.

17. The method according to claim 16, wherein the noble gas is argon.

18. The method according to claim 1, wherein the structuring step comprises plasma etching the layer to be structured.

19. The method according to claim 1, wherein the removing step comprises removing the sacrificial layer and the mask with a lift-off technique.

20. The method according to claim 1, wherein the removing step comprises incinerating the sacrificial layer and scrubbing off the mask material.

21. The method according to claim 1, which comprises patterning the mask by a photographic technique.

22. The method according to claim 21, wherein the patterning step comprises prepatterning the mask with a resist mask, removing the resist mask, and subsequently completely pattern the mask.

* * * * *